(12) United States Patent
Horii

(10) Patent No.: US 9,691,616 B2
(45) Date of Patent: Jun. 27, 2017

(54) METHOD OF MANUFACTURING SILICON CARBIDE SEMICONDUCTOR DEVICE BY USING PROTECTIVE FILMS TO ACTIVATE DOPANTS IN THE SILICON CARBIDE SEMICONDUCTOR DEVICE

(71) Applicant: Sumitomo Electric Industries, Ltd., Osaka-shi (JP)

(72) Inventor: Taku Horii, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/024,345

(22) PCT Filed: Aug. 5, 2014

(86) PCT No.: PCT/JP2014/070558
§ 371 (c)(1),
(2) Date: Mar. 23, 2016

(87) PCT Pub. No.: WO2015/045627
PCT Pub. Date: Apr. 2, 2015

(65) Prior Publication Data
US 2016/0240380 A1 Aug. 18, 2016

(30) Foreign Application Priority Data
Sep. 25, 2013 (JP) .................. 2013-198563

(51) Int. Cl.
*H01L 21/04* (2006.01)
*H01L 29/16* (2006.01)
(Continued)

(52) U.S. Cl.
CPC .... *H01L 21/0465* (2013.01); *H01L 21/02115* (2013.01); *H01L 21/02252* (2013.01);
(Continued)

(58) Field of Classification Search
CPC ............. H01L 21/0445; H01L 21/0455; H01L 21/046; H01L 21/0465; H01L 21/02115; H01L 21/02252
See application file for complete search history.

(56) References Cited

U.S. PATENT DOCUMENTS

2002/0172908 A1* 11/2002 Minami .................. C30B 31/14
432/253
2006/0220027 A1 10/2006 Takahashi et al.
(Continued)

FOREIGN PATENT DOCUMENTS

JP 2001-068428 A 3/2001
JP 2009-065112 A 3/2009
(Continued)

OTHER PUBLICATIONS

International Search Report in International Application No. PCT/JP2014/070558, dated Nov. 4, 2014.

*Primary Examiner* — Michael Jung
(74) *Attorney, Agent, or Firm* — Venable LLP; Michael A. Sartori; Laura G. Remus

(57) ABSTRACT

A method of manufacturing a silicon carbide semiconductor device includes a step of preparing a silicon carbide substrate having a first main surface and a second main surface located opposite to the first main surface, a step of forming a doped region in the silicon carbide substrate by doping the first main surface with an impurity, a step of forming a first protecting film on the first main surface, and a step of forming a second protecting film on the second main surface, the step of forming a first protecting film being performed after the step of forming a doped region, the method further including a step of activating the impurity included in the doped region by annealing with at least a portion of the first main surface covered with the first (Continued)

protecting film and at least a portion of the second main surface covered with the second protecting film.

7 Claims, 7 Drawing Sheets

(51) Int. Cl.
    *H01L 29/66*     (2006.01)
    *H01L 29/78*     (2006.01)
    *H01L 21/02*     (2006.01)

(52) U.S. Cl.
    CPC .......... *H01L 21/046* (2013.01); *H01L 21/049* (2013.01); *H01L 29/1608* (2013.01); *H01L 29/66068* (2013.01); *H01L 29/7802* (2013.01)

(56) References Cited

U.S. PATENT DOCUMENTS

| | | | |
|---|---|---|---|
| 2009/0042375 A1 | 2/2009 | Sawada et al. | |
| 2009/0186470 A1 | 7/2009 | Takahashi et al. | |
| 2010/0093161 A1* | 4/2010 | Kusumoto | H01L 29/7811 438/522 |
| 2011/0223694 A1* | 9/2011 | Uda | C23C 16/325 438/14 |
| 2012/0028453 A1* | 2/2012 | Matsuno | H01L 21/046 438/522 |
| 2012/0231618 A1* | 9/2012 | Masuda | H01L 29/66068 438/522 |
| 2013/0023113 A1 | 1/2013 | Masuda et al. | |
| 2014/0117380 A1* | 5/2014 | Loboda | H01L 21/02035 257/77 |
| 2014/0264579 A1* | 9/2014 | Pala | H01L 29/7802 257/339 |
| 2015/0044840 A1* | 2/2015 | Kobayashi | H01L 21/0223 438/285 |
| 2015/0072448 A1* | 3/2015 | Kobayashi | H01L 21/26513 438/17 |
| 2016/0111499 A1* | 4/2016 | Hisamoto | H01L 21/045 257/77 |

FOREIGN PATENT DOCUMENTS

| | | |
|---|---|---|
| WO | WO-2005/076327 A1 | 8/2005 |
| WO | WO-2008/120469 A1 | 10/2008 |
| WO | WO-2011/016392 A1 | 2/2011 |
| WO | WO-2013/011740 A1 | 1/2013 |

* cited by examiner

METHOD OF MANUFACTURING SILICON CARBIDE SEMICONDUCTOR DEVICE BY USING PROTECTIVE FILMS TO ACTIVATE DOPANTS IN THE SILICON CARBIDE SEMICONDUCTOR DEVICE

TECHNICAL FIELD

The present invention relates to silicon carbide semiconductor devices. More specifically, the present invention relates to a method of manufacturing a silicon carbide semiconductor device.

BACKGROUND ART

In recent years, a silicon carbide semiconductor device has made progress toward practical utilization as a power semiconductor device. This is because the use of a silicon carbide material for a semiconductor device is expected to increase breakdown voltage and reduce on-resistance as compared to a currently predominant semiconductor device made of a silicon material. In the process of manufacturing such a silicon carbide semiconductor device, a semiconductor substrate is doped with an impurity by an ion implantation process, for example (see Japanese Patent Laying-Open No. 2001-68428 (PTD 1), for example).

CITATION LIST

Patent Document

PTD 1: Japanese Patent Laying-Open No. 2001-68428

SUMMARY OF INVENTION

Technical Problem

A doped region formed by an ion implantation process or the like is then activated by annealing. In this case, an annealing temperature reaches a high temperature greater than or equal to 1500° C., resulting in sublimation and the like on an upper surface of a substrate, which may cause surface roughness. When such surface roughness occurs, a manufacturing yield of semiconductor devices is reduced.

In order to address this problem, PTD 1 discloses a method of forming a protecting film on an upper surface of a silicon carbide substrate, followed by annealing. With this method, the sublimation can be suppressed by the protecting film, thereby preventing the surface roughness on the upper surface of the substrate.

With the recent transition to practical utilization of a silicon carbide semiconductor device, reducing the cost of a semiconductor substrate is a pressing problem. While a silicon carbide semiconductor substrate has a diameter of up to 4 inches at present, a large-diameter substrate exceeding 4 inches is required to reduce the cost. A study conducted by the present inventor, however, revealed that an industrially sufficient yield could not be obtained for such large-diameter substrates even if a protecting film is formed on an upper surface of the substrates.

In view of the problem as described above, an object is to provide a method by which silicon carbide semiconductor devices can be manufactured at a high yield.

Solution to Problem

A method of manufacturing a silicon carbide semiconductor device according to one embodiment of the present invention includes the steps of preparing a silicon carbide substrate having a first main surface and a second main surface located opposite to the first main surface, forming a doped region in the silicon carbide substrate by doping the first main surface with an impurity, forming a first protecting film on the first main surface, and forming a second protecting film on the second main surface, the step of forming a first protecting film being performed after the step of forming a doped region, the method further including the step of activating the impurity included in the doped region by annealing with at least a portion of the first main surface being covered with the first protecting film and at least a portion of the second main surface being covered with the second protecting film.

Advantageous Effects of Invention

According to above, silicon carbide semiconductor devices can be manufactured at a high yield.

DESCRIPTION OF EMBODIMENTS

Figure 1:
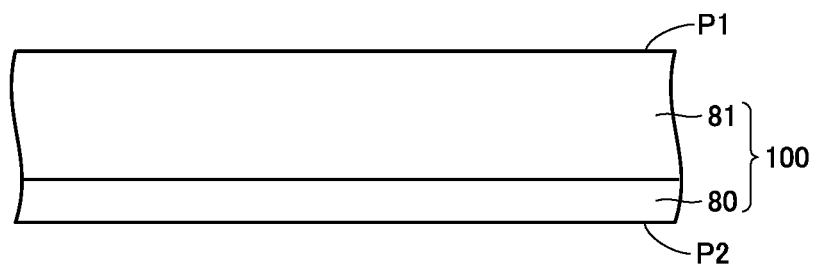
FIG. 1 is a schematic sectional view illustrating part of a method of manufacturing a silicon carbide semiconductor device of an embodiment.

An embodiment according to the present invention is described below in more detail. In the drawings of the present application, the same or corresponding parts are designated by the same reference signs and the same description will not be repeated.

[Description of Embodiment of the Present Invention]

First, an outline of the embodiment of the present invention (hereinafter also referred to as "the present embodiment") will be listed and described in (1) to (9) below.

The present inventor conducted a diligent study in order to solve the problem described above, and completed the present embodiment based on the findings that, as the diameter of a substrate increases, adhesion between a susceptor holding the silicon carbide substrate and the silicon carbide substrate decreases during annealing, which leads to sublimation of atoms from a lower surface of the substrate as well, resulting in a disadvantage such as warpage of the substrate. That is, a method of manufacturing a silicon carbide semiconductor device according to the present embodiment includes a configuration described below.

(1) The method includes a step S1 of preparing a silicon carbide substrate 100 having a first main surface P1 and a second main surface P2 located opposite to first main surface P1, a step S2 of forming a doped region in silicon carbide substrate 100 by doping first main surface P1 with an impurity, a step S3 of forming a first protecting film 10 on first main surface P1, and a step S4 of forming a second protecting film 20 on second main surface P2, step S3 of forming a first protecting film 10 being performed after step S2 of forming a doped region, the method further including a step S5 of activating the impurity included in the doped region by annealing with at least a portion of first main surface P1 being covered with first protecting film 10 and at least a portion of second main surface P2 being covered with second protecting film 20.

Conventionally, during annealing for activating an impurity included in a doped region (hereinafter also referred to as "activation annealing") in the manufacture of a silicon carbide semiconductor device, surface roughness of a substrate has been a problem only at an upper surface (first main surface P1) of the substrate. This may be because a gap is not formed between a substrate having a relatively small diameter and a susceptor. As the diameter of the substrate increases, however, sublimation of atoms from the substrate occurs through a small gap formed between the substrate and the susceptor, resulting in surface roughness locally at a lower surface (second main surface P2). Then, substrate warpage originates from this surface roughness, and the gap increases due to the substrate warpage to facilitate the surface roughness at the lower surface.

In the present embodiment, by forming first protecting film 10 on an upper surface of silicon carbide substrate 100 and forming second protecting film 20 on a lower surface of silicon carbide substrate 100, the surface roughness can be suppressed at the lower surface of the substrate as well, thereby preventing the substrate warpage.

(2) Preferably, at least one of first protecting film 10 and second protecting film 20 is an organic film. This is because an organic film becomes a carbon film by being carbonized in a temperature increasing process of activation annealing, and can thereby become a protecting film that can resist the activation annealing. As the organic film, a photoresist commonly used for manufacturing a semiconductor device can be used, for example.

(3) Preferably, at least one of first protecting film 10 and second protecting film 20 is a diamond-like carbon film. A diamond-like carbon film (hereinafter also referred to as a "DLC film") can have heat resistance to resist activation annealing. In addition, a DLC film can be readily formed by a process such as ECR (Electron Cyclotron Resonance) sputtering.

(4) Preferably, at least one of first protecting film 10 and second protecting film 20 is a carbon layer. A carbon layer can have heat resistance to resist activation annealing.

(5) Preferably, the carbon layer is formed by partially removing silicon from silicon carbide substrate 100. The carbon layer thus formed can become a layer including carbon derived from silicon carbide substrate 100. Such a carbon layer can densely cover the surface of silicon carbide substrate 100, thereby efficiently suppressing the sublimation of atoms from the substrate.

(6) Preferably, second protecting film 20 covers the entire second main surface P2. Thereby, substantially the entire portion of silicon carbide substrate 100 that is used as a device can be covered. Thus, the substrate warpage can be more efficiently prevented.

(7) Preferably, a plurality of silicon carbide substrates 100 are prepared in preparing step S1, and in activating step S5, the plurality of the silicon carbide substrates 100 are annealed while being held with spacing between each of the substrates along a direction intersecting with first main surface P1.

In the present embodiment, since second protecting film 20 is formed on second main surface P2 as well, the activation annealing can be performed with second main surface P2 being exposed. That is, the limitation in the step that requires silicon carbide substrate 100 to be held by a susceptor or the like is removed during the activation annealing. Thereby, substrates 100 can be stacked with spacing between them in the direction intersecting with first main surface P1 (for example, a longitudinal direction perpendicular to first main surface P1) for collective processing of the plurality of substrates. This can significantly improve the productivity of the silicon carbide semiconductor device.

(8) Preferably, silicon carbide substrate 100 has a diameter greater than or equal to 100 mm. That is, silicon carbide substrate 100 can have a diameter greater than or equal to 4 inches, for example. By using the method of manufacturing a silicon carbide semiconductor device of the present embodiment, large-diameter substrates having a diameter greater than or equal to 100 mm can be manufactured at a high yield. This can reduce the cost of the silicon carbide semiconductor device.

(9) Preferably, silicon carbide substrate 100 has a thickness less than or equal to 600 µm. By using the method of manufacturing a silicon carbide semiconductor device of the present embodiment, the substrate warpage can be prevented, thus allowing for manufacture of a thin substrate having a thickness less than or equal to 600 µm. Conventionally, such a thin substrate has suffered from a disadvantage such as substrate warpage during annealing, and therefore has been manufactured by activation annealing of a substrate having a thickness exceeding 600 µm, followed by polishing and the like. In contrast, in the present embodiment, a substrate having a thickness less than or equal to 600 µm can be subjected to activation annealing, thus making more efficient use of resources than conventional use.

[Details of Embodiment of the Present Invention]

The method of manufacturing a silicon carbide semiconductor device of the present embodiment is now described in more detail, however, the present embodiment is not thus limited.

<Method of Manufacturing Silicon Carbide Semiconductor Device>

Figure 14:
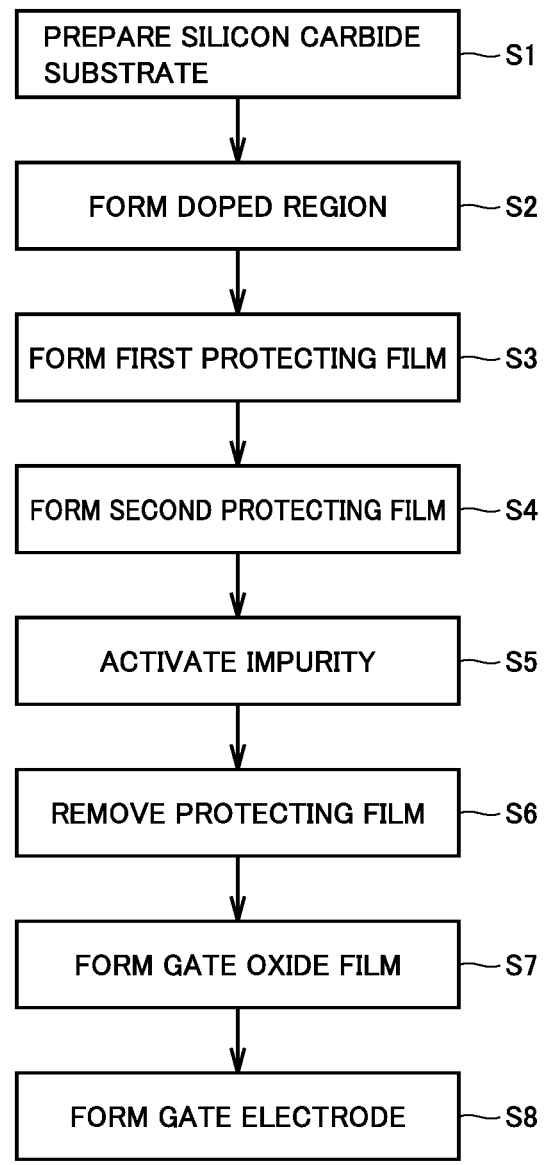
FIG. 14 is a flowchart showing an outline of the method of manufacturing the silicon carbide semiconductor device according to the embodiment.

FIG. 14 is a flowchart showing an outline of the method of manufacturing a silicon carbide semiconductor device according to the present embodiment. As shown in FIG. 14, the method of manufacturing a silicon carbide semiconductor device of the present embodiment includes steps S1, S2, S3, S4, S5, S6, S7 and S8. In the present embodiment, since activation annealing (step S5) is performed with at least a portion of second main surface P2 which is a lower surface of the substrate being covered with second protecting film 20, the sublimation at the lower surface (backside surface) of the substrate can be suppressed, thereby preventing the substrate warpage.

The steps are now described. It is noted that first protecting film 10 and second protecting film 20 may collectively be referred to simply as a "protecting film" in the following description.

<Step S1>

FIG. 1 is a schematic sectional view illustrating step S1 in the method of manufacturing a silicon carbide semiconductor device of the present embodiment. Referring to FIG. 1, a silicon carbide substrate 100 having a first main surface P1 and a second main surface P2 located opposite to first main surface P1 is prepared. Silicon carbide substrate 100 includes a silicon carbide single-crystal substrate 80 and a silicon carbide epitaxial layer 81 epitaxially grown thereon.

It is preferable that silicon carbide substrate 100 have a diameter greater than or equal to 100 mm (for example, greater than or equal to 4 inches). This is because a large-diameter substrate having a diameter greater than or equal to 100 mm can reduce the cost of manufacturing the silicon carbide semiconductor device. In addition, it is preferable that silicon carbide substrate 100 have a thickness less than or equal to 600 μm. Conventionally, it has been difficult to produce such large-diameter substrates and thin substrates at a suitable yield due to large substrate warpage. In contrast, in the present embodiment, annealing is performed with a protecting film having been formed on each of first main surface P1 and second main surface P2 as will be described later, allowing for production of large-diameter substrates and thin substrates at an industrially suitable yield. The diameter of silicon carbide substrate 100 is more preferably greater than or equal to 125 mm (for example, greater than or equal to 5 inches), and particularly preferably greater than or equal to 150 mm (for example, greater than or equal to 6 inches). In addition, the thickness of silicon carbide substrate 100 is more preferably less than or equal to 400 μm, and particularly preferably less than or equal to 300 μm. This can further reduce the cost of the silicon carbide semiconductor device.

Silicon carbide single-crystal substrate 80 is made of, for example, hexagonal silicon carbide having a polytype of 4H. Silicon carbide single-crystal substrate 80 is prepared, for example, by slicing an ingot (not shown) made of silicon carbide single crystal. Silicon carbide single-crystal substrate 80 includes an impurity such as nitrogen (N) and has n type conductivity.

A lower surface of silicon carbide single-crystal substrate 80 constitutes second main surface P2 of silicon carbide substrate 100. An upper surface of silicon carbide single-crystal substrate 80 is a surface where epitaxial growth is performed.

Silicon carbide epitaxial layer 81 has, for example, a hexagonal crystal structure having a polytype of 4H. An upper surface of silicon carbide epitaxial layer 81 constitutes first main surface P1. Silicon carbide epitaxial layer 81 has n type conductivity, for example. The epitaxial growth of silicon carbide epitaxial layer 81 can be performed by a CVD (Chemical Vapor Deposition) process using a mixed gas of silane ($SiH_4$) and propane ($C_3H_8$) as a material gas, for example, and using hydrogen ($H_2$) as a carrier gas, for example. In doing so, it is preferable to introduce nitrogen (N) or phosphorus (P) as an impurity, for example. In this case, it is preferable to adjust an impurity concentration in silicon carbide epitaxial layer 81 such that it is lower than an impurity concentration in silicon carbide single-crystal substrate 80.

<Step S2>

Figure 5:
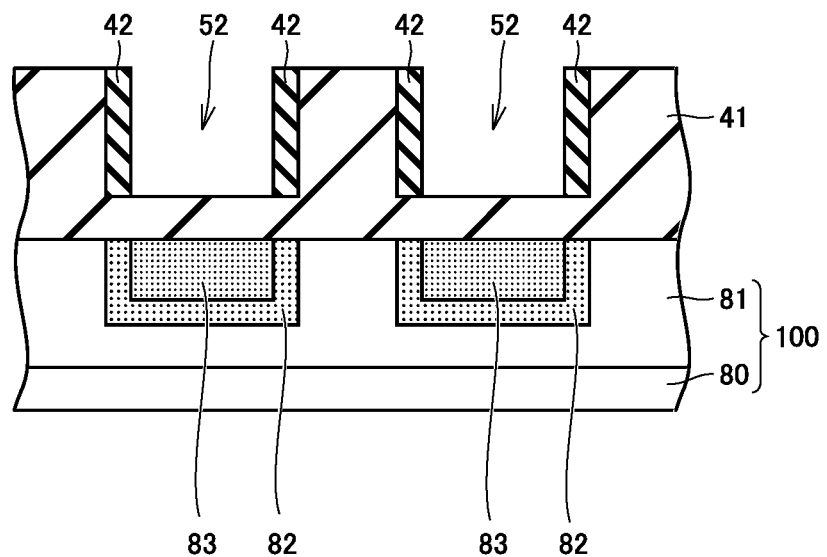
FIG. 5 is a schematic sectional view illustrating part of the method of manufacturing the silicon carbide semiconductor device of the embodiment.
Figure 6:
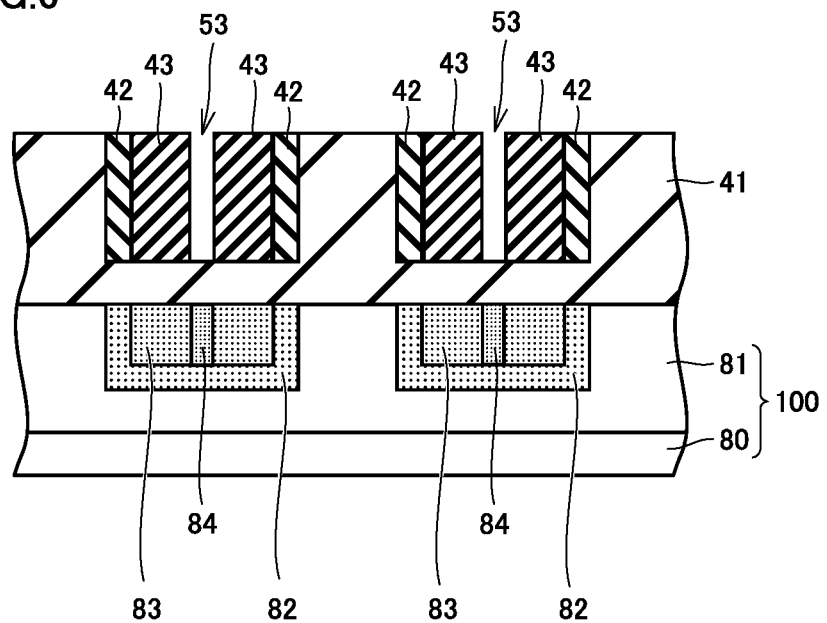
FIG. 6 is a schematic sectional view illustrating part of the method of manufacturing the silicon carbide semiconductor device of the embodiment.
Figure 7:
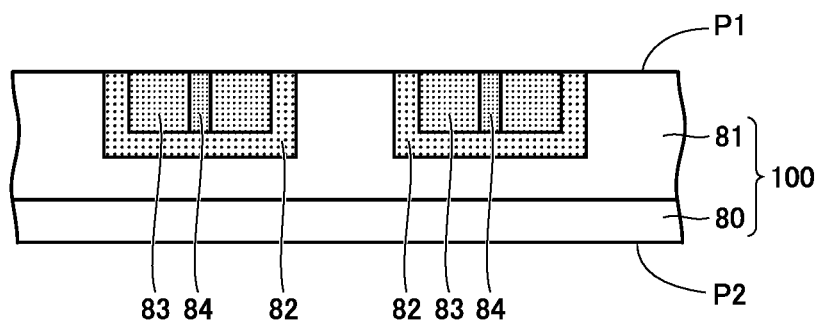
FIG. 7 is a schematic sectional view illustrating part of the method of manufacturing the silicon carbide semiconductor device of the embodiment.

FIGS. 2 to 7 are schematic sectional views illustrating step S2. Referring to FIGS. 2 to 7, a mask layer having a prescribed opening is formed on first main surface P1 and ion implantation is selectively performed, to form doped regions shown in FIG. 7 (a p body layer 82, an n+ layer 83 and a p contact region 84). While the present embodiment illustrates a method of forming the doped regions by an ion implantation process, the doped regions may be formed by epitaxial growth involving the addition of impurities. Further, the arrangement of the doped regions shown in FIG. 7 is merely exemplary and can be altered as appropriate.

Figure 2:
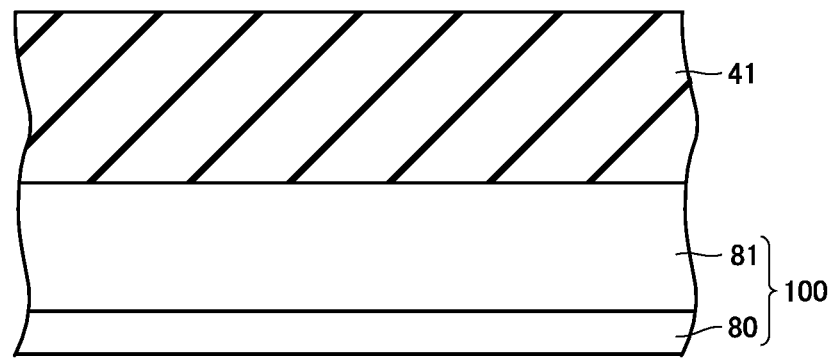
FIG. 2 is a schematic sectional view illustrating part of the method of manufacturing the silicon carbide semiconductor device of the embodiment.

First, referring to FIG. 2, a first mask layer 41 is formed on first main surface P1. First mask layer 41 is made of silicon dioxide, silicon nitride and silicon oxynitride, for example, and can be formed by a thermal CVD process and a photo CVD process, for example. A low-pressure thermal CVD process is suitable as the thermal CVD process. A silicon dioxide layer can be formed, for example, by supplying TEOS (Tetraethyl orthosilicate) gas into a chamber in which silicon carbide substrate 100 has been disposed at a flow rate of about greater than or equal to 60 sccm and less than or equal to 100 sccm and at a temperature of about greater than or equal to 600° C. and less than or equal to 800° C., and setting the pressure to be about greater than or equal to 0.8 Torr and less than or equal to 1.4 Torr.

First mask layer 41 may include a silicon dioxide layer (not shown) formed by thermal oxidation of first main surface P1, an etching stop layer (not shown) made of polysilicon, and the like. With first mask layer 41 including the etching stop layer, damage to the substrate during subsequent etching of first mask layer 41 is mitigated.

The etching stop layer made of polysilicon can be formed, for example, by supplying silane ($SH_4$) gas into the chamber in which silicon carbide substrate 100 has been disposed at a flow rate of about greater than or equal to 800 sccm and less than or equal to 1200 sccm and at a temperature of about greater than or equal to 500° C. and less than or equal to 700° C., and setting the pressure to be about greater than or equal to 0.4 Torr and less than or equal to 0.8 Torr.

Figure 3:
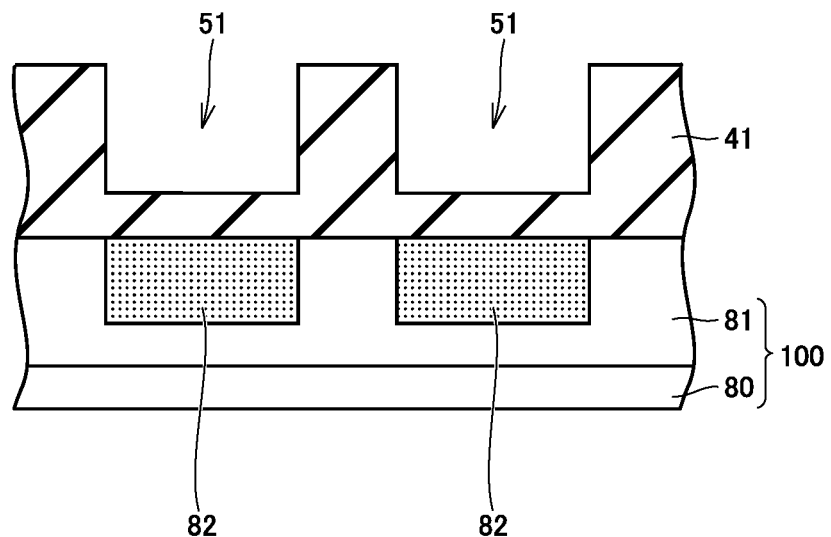
FIG. 3 is a schematic sectional view illustrating part of the method of manufacturing the silicon carbide semiconductor device of the embodiment.

Next, referring to FIG. 3, a first opening 51 is formed in first mask layer 41. First opening 51 is formed by removing a portion of first mask layer 41 by means of etching using $CF_4$ or $CHF_3$, for example. After first opening 51 is formed, ion implantation is performed through first mask layer 41 to form p body layer 82. An impurity implanted in this case is a p type impurity such as aluminum (Al) or boron (B).

Figure 4:
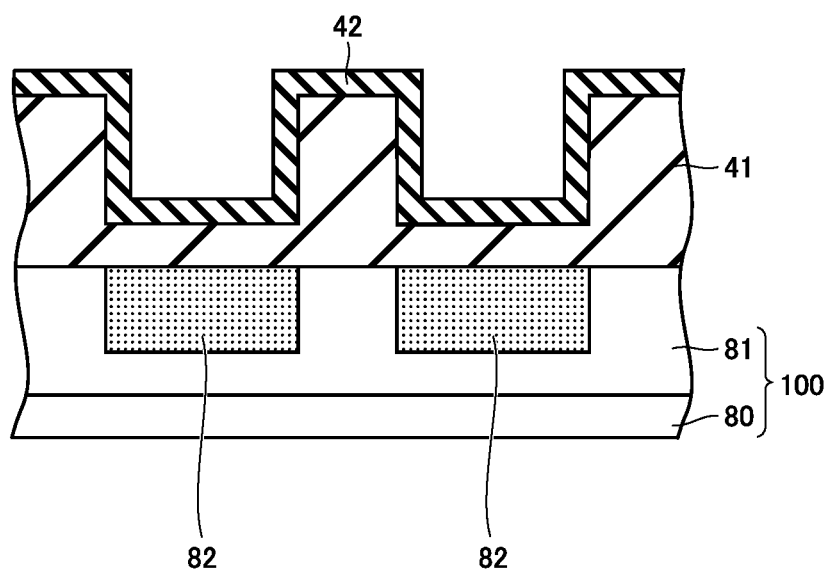
FIG. 4 is a schematic sectional view illustrating part of the method of manufacturing the silicon carbide semiconductor device of the embodiment.

Next, referring to FIG. 4, a second mask layer 42 is formed on first mask layer 41. Second mask layer 42 is a silicon dioxide layer, for example, and can be formed by a low-pressure CVD process. Then, a portion of second mask layer 42 is removed by anisotropic etching on second mask layer 42, to form a second opening 52 having a width smaller than that of first opening 51, as shown in FIG. 5. Then, ion implantation is performed through first mask layer 41 and second mask layer 42 to form n+ layer 83. An impurity implanted in this case is an n type impurity such as phosphorus (P) or nitrogen (N).

Further, referring to FIG. 6, a third mask layer 43 having a third opening 53 having a width smaller than that of second opening 52 is formed by employing a combination of layer formation and anisotropic etching. Third mask layer 43 is a silicon dioxide layer, for example, and can be formed by a low-pressure CVD process. Then, ion implantation is performed through first mask layer 41, second mask layer 42 and third mask layer 43 to form p contact region 84. An impurity implanted in this case is a p type impurity such as aluminum (Al) or boron (B).

Next, referring to FIG. 7, first mask layer 41, second mask layer 42 and third mask layer 43 are removed. if the mask layers are silicon dioxide layers, the mask layers can be removed by wet etching using hydrofluoric acid, for example. The layer made of polysilicon can be removed by dry etching, for example.

<Step S3>

Figure 8:
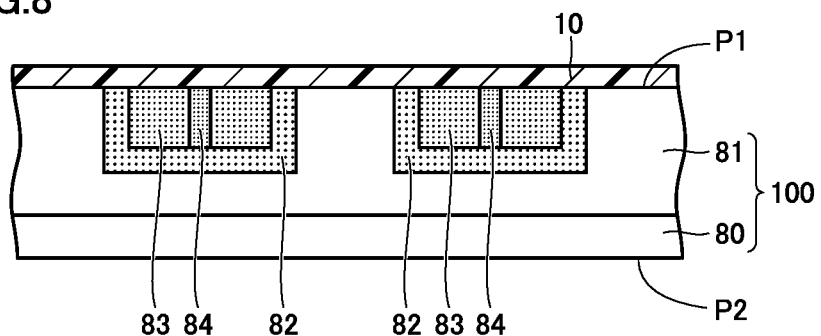
FIG. 8 is a schematic sectional view illustrating part of the method of manufacturing the silicon carbide semiconductor device of the embodiment.

FIG. 8 is a schematic sectional view illustrating step S3. Referring to FIG. 8, after the doped regions are formed in silicon carbide epitaxial layer 81, step S3 of forming first protecting film 10 on the doped regions at first main surface P1 is performed. As shown in FIG. 8, first protecting film 10 covers at least a portion of first main surface P1. Thereby, the sublimation of atoms from first main surface P1 can be prevented. It is preferable that first protecting film 10 cover each doped region. That is, it is preferable that first protecting film 10 cover the entire portion of first main surface P1 that is utilized as a device. This is because the sublimation tends to occur particularly in a doped region. More preferably, first protecting film 10 covers substantially the entire first main surface P1. A material constituting first protecting film 10 will be described later.

<Step S4>

Figure 9:
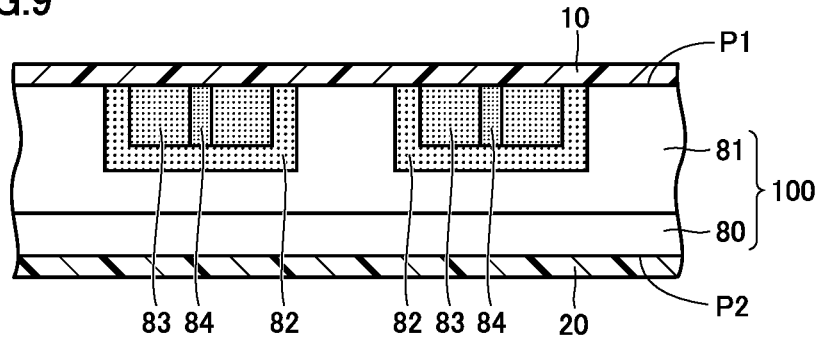
FIG. 9 is a schematic sectional view illustrating part of the method of manufacturing the silicon carbide semiconductor device of the embodiment.

FIG. 9 is a schematic sectional view illustrating step S4. Referring to FIG. 9, second protecting film 20 is formed on second main surface P2. Second protecting film 20 covers at least a portion of second main surface P2. Thereby, the sublimation of atoms from second main surface P2 can be suppressed, thereby preventing the surface roughness and warpage of the substrate. It is preferable that second protecting film 20 cover most of second main surface P2 (that is, greater than or equal to 50% of second main surface P2). Thereby, an adequate quality of the substrate can be secured. It is more preferable that second protecting film 20 cover the entire region not including a portion within 2 mm from an edge portion of second main surface P2 (that is, it is preferable that second protecting film 20 cover substantially the entire second main surface P2). While the present embodiment illustrates a flow of steps in which step S4 is performed after step S3, step S4 may be performed at any timing as long as it is before step S5 (that is, activation annealing). Alternatively, step S3 and step S4 may be performed substantially at the same time.

<First Protecting Film and Second Protecting Film>

First protecting film 10 and second protecting film 20 formed in step S3 and step S4 may be formed of materials different from each other, but are preferably formed of the same material. This is because the use of the same material can reduce the burden imposed in the steps. First protecting film 10 and second protecting film 20 preferably have heat resistance to resist activation annealing, and are suitably a carbon film obtained by heating and carbonizing an organic film, a DLC film and a carbon layer, for example.

(Organic Film)

An organic film can, owing to its inclusion of carbon atoms (C), become a carbon film by being carbonized in a temperature increasing process of activation annealing. This carbon film can then become a protecting film that can resist activation annealing performed at a temperature exceeding 1500° C. Moreover, since the carbon atoms in the vicinity of the surface of silicon carbide epitaxial layer 81 and the carbon atoms in the protecting film can be bonded together, the adhesion between silicon carbide epitaxial layer 81 and the protecting film is improved, thereby efficiently preventing the sublimation of atoms from silicon carbide epitaxial layer 81.

As the organic film, various types of resins such as an acrylic resin, a phenolic resin, a urea resin, and an epoxy resin can be used. Alternatively, a resin composed as a photosensitive resin that is cross-linked or decomposed by action of light can be used. As the photosensitive resin, a positive or negative photoresist commonly used for manufacturing a semiconductor device can be used. A photoresist is suitable because the technique of applying a photoresist by a spin coating process has been established and the thickness of a photoresist can be readily controlled. If a photoresist is used, it is preferable to dispose the material on first main surface P1 and second main surface P2, then bake the material at a temperature of about 100° C. to 200° C. to vaporize a solvent, for example, to thereby fix the material.

(DLC Film)

A DLC film can also be used as first protecting film 10 and second protecting film 20. A DLC film can also have heat resistance to resist activation annealing, thereby preventing the sublimation of atoms from the surfaces of the substrate. A DLC film can be readily formed by ECR sputtering, for example.

(Carbon Layer)

First protecting film 10 and second protecting film 20 may be carbon layers formed by partially removing silicon from silicon carbide substrate 100. A carbon layer can be formed, for example, by performing thermal etching on first main surface P1 or second main surface P2 at a temperature greater than or equal to 700° C. and less than or equal to 1000° C. under a reactive gas atmosphere including chlorine ($Cl_2$) to thereby partially (selectively) remove silicon from first main surface P1 or second main surface P2. The carbon layer thus formed can also have heat resistance to resist activation annealing, thereby preventing the sublimation of atoms from the surfaces of the substrate.

The thickness of first protecting film 10 and second protecting film 20 is preferably greater than or equal to 0.5 μm from the viewpoint of preventing the surface roughness and warpage of the substrate, and preferably less than or equal to 10 μm from the viewpoint of the amount of material used. From a similar viewpoint, the thickness of first protecting film 10 and second protecting film 20 is more preferably greater than or equal to 1 μm and less than or equal to 5 μm. The thickness of first protecting film 10 and second protecting film 20 can be about 3 μm, for example.

<Step S5>

In step S5, the impurities included in the doped regions are activated by annealing with first protecting film 10 and second protecting film 20 having been formed. Thereby, desired carriers are generated in the doped regions. A temperature of the activation annealing is preferably greater than or equal to 1500° C. and less than or equal to 2000° C., and is about 1800° C., for example. The time of the activation annealing can be about 30 minutes, for example. The activation annealing is preferably performed under an inert gas atmosphere, and can be performed under an argon (Ar) atmosphere, for example. In the present embodiment, since the annealing is performed with first protecting film 10 and second protecting film 20 having been formed, the surface roughness and warpage of a substrate do not occur even with a large-diameter substrate having a diameter greater than or equal to 100 mm, thus allowing for manufacture of a high quality substrate.

Figure 13:
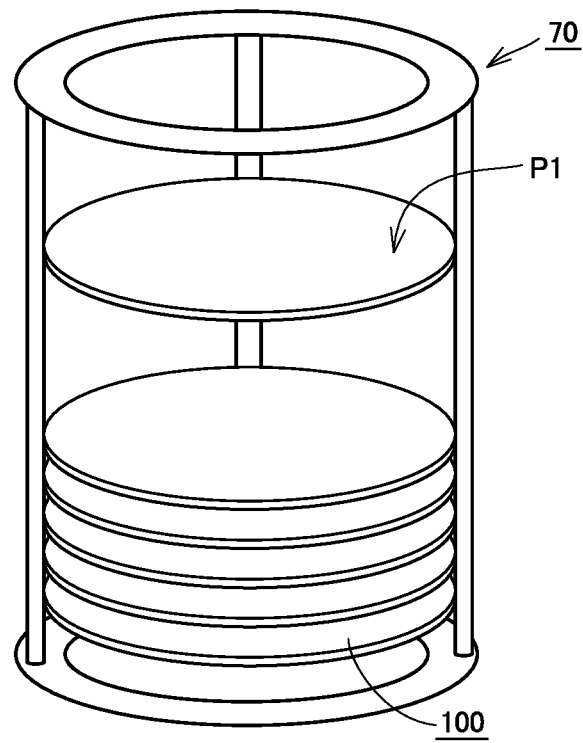
FIG. 13 is a schematic perspective view illustrating a jig according to the method of manufacturing the silicon carbide semiconductor device of the embodiment.

Moreover, by forming second protecting film 20, the annealing can be performed with second main surface P2 being in an open state. Conventionally, activation annealing has been performed with a substrate being held by a susceptor or the like and placed in a furnace, and therefore, a certain limitation has been imposed on the throughput in this step. In contrast, in the present embodiment, a plurality of silicon carbide substrates 100 can be annealed while being stacked and held in a prescribed jig 70 as shown in FIG. 13, for example. That is, the plurality of silicon carbide substrates 100 are prepared in preparing step S1, and in activating step S5, the plurality of silicon carbide substrates 100 can be annealed while being held with spacing between each of the substrates along a direction intersecting with first main surface P1. That is, there can also be provided a manufacturing method suitable for mass production of large-diameter substrates, making efficient use of space within a furnace of existing equipment. This can significantly improve the processing efficiency of activation annealing, thereby reducing the cost of manufacturing the silicon carbide semiconductor device.

<Step S6>

After step S5, first protecting film 10 and second protecting film 20 are removed. The protecting films can be removed by any process without being particularly limited. If the protecting films are photoresists, they can be removed by photoexcited ashing or plasma ashing, for example. Wet cleaning using a prescribed cleaning solution can also be used in combination with the ashing.

<Step S7>

Figure 10:
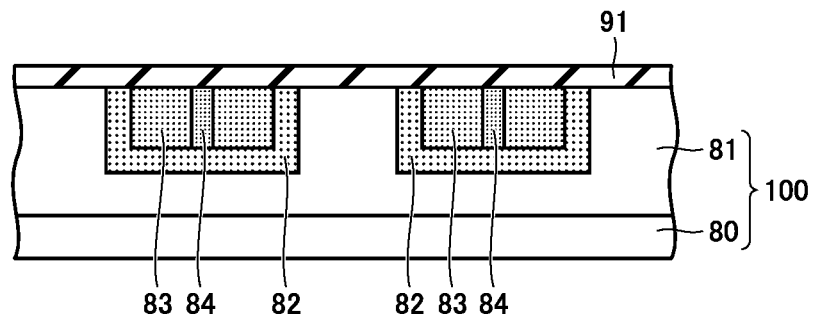
FIG. 10 is a schematic sectional view illustrating part of the method of manufacturing the silicon carbide semiconductor device of the embodiment.

Next, referring to FIG. 10, a gate insulating film 91 is formed. Gate insulating film 91 is a silicon dioxide film, for example, and is preferably formed by thermal oxidation. Gate insulating film 91 which is a silicon dioxide film can be formed, for example, by heating silicon carbide substrate 100 to about 1300° C. in an atmosphere including oxygen. After gate insulating film 91 is formed, NO annealing using nitrogen monoxide (NO) gas as an atmospheric gas may be performed. The NO annealing is performed, for example, at a temperature greater than or equal to 1100° C. and less than or equal to 1300° C. and continues for about one hour.

<Step S8>

Figure 11:
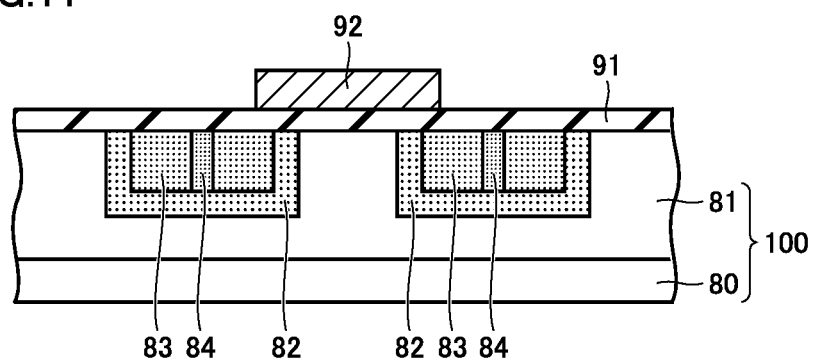
FIG. 11 is a schematic sectional view illustrating part of the method of manufacturing the silicon carbide semiconductor device of the embodiment.

Next, referring to FIG. 11, a gate electrode 92 is formed. Gate electrode 92 is formed on gate insulating film 91. Gate electrode 92 is made of polysilicon including an impurity such as phosphorus, and can be formed by a low-pressure CVD process. Gate electrode 92 is formed on gate insulating film 91 so as to face p body layer 82 and n+ layer 83. Then, an interlayer insulating film 93 is formed by a plasma CVD process, for example, in contact with gate electrode 92 and gate insulating film 91 so as to surround gate electrode 92. Interlayer insulating film 93 is made of silicon dioxide, for example.

Figure 12:
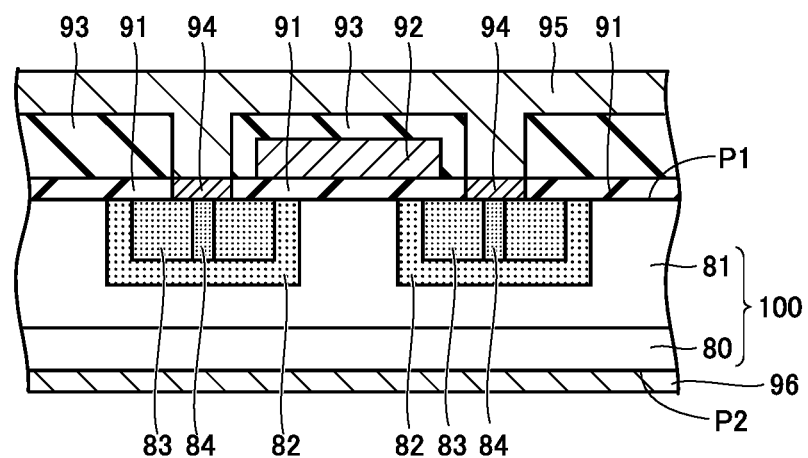
FIG. 12 is a schematic sectional view illustrating part of the method of manufacturing the silicon carbide semiconductor device of the embodiment.

Next, a post process is described with reference to FIG. 12. Gate insulating film 91 and interlayer insulating film 93 that have been formed to face n+ layer 83 and p contact region 84 are removed by dry etching, for example. Further, a metal film including titanium (Ti), aluminum (Al) and silicon (Si), for example, is formed by sputtering in contact with n+ layer 83, p contact region 84 and gate insulating film 91. Subsequently, silicon carbide substrate 100 having this metal film formed thereon is heated to about 1000° C., for example, to alloy the metal film, thereby forming a source electrode 94 in ohmic contact with silicon carbide substrate 100. Further, a source wiring layer 95 is formed so as to be electrically connected to source electrode 94. Source wiring layer 95 includes aluminum, for example, and may be formed to cover interlayer insulating film 93. Moreover, a drain electrode 96 is formed in contact with second main surface P2 of silicon carbide substrate 100.

In this manner, silicon carbide semiconductor devices can be manufactured at a high yield.

While a planar MOSFET (Metal Oxide Semiconductor Field Effect Transistor) has been described by way of example as the silicon carbide semiconductor device in the present embodiment, the silicon carbide semiconductor device may be a trench MOSFET. Alternatively, the silicon carbide semiconductor device may be an IGBT (Insulated Gate Bipolar Transistor) or an SBD (Schottky Barrier Diode), for example.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST 10 first protecting film; 20 second protecting film; 41 first mask layer; 42 second mask layer; 43 third mask layer; 51 first opening; 52 second opening; 53 third opening; 70 jig; 80 silicon carbide single-crystal substrate; 81 silicon carbide epitaxial layer; 82 p body layer; 83 n+layer; 84 p contact region; 91 gate insulating film; 92 gate electrode; 93 interlayer insulating film; 94 source electrode; 95 source wiring layer; 96 drain electrode; 100 silicon carbide substrate; P1 first main surface; P2 second main surface.

The invention claimed is:

1. A method of manufacturing a silicon carbide semiconductor device, comprising the steps of:
    preparing one or more silicon carbide substrates having a first main surface and a second main surface located opposite to the first main surface;
    forming a doped region in the silicon carbide substrate by doping the first main surface with an impurity;
    forming a first protecting film on the first main surface; and
    forming a second protecting film on the second main surface,
    the step of forming the first protecting film being performed after the step of forming the doped region, and
    the method further comprising the step of activating the impurity included in the doped region by annealing with at least a portion of the first main surface being covered with the first protecting film and at least a portion of the second main surface being covered with the second protecting film, wherein
    at least one of the first protecting film and the second protecting film is a resinous organic film.

2. The method of manufacturing a silicon carbide semiconductor device according to claim 1, wherein
    the second protecting film covers the entire second main surface.

3. The method of manufacturing a silicon carbide semiconductor device according to claim 1, wherein
    a plurality of the silicon carbide substrates are prepared in the preparing step, and
    in the activating step, the plurality of the silicon carbide substrates are annealed while being held with spacing between each of the silicon carbide substrates along a direction intersecting with the first main surface.

4. The method of manufacturing a silicon carbide semiconductor device according to claim 1, wherein
the resinous organic film comprises a resin selected from the group consisting of an acrylic resin, a phenolic resin, a urea resin and an epoxy resin.

5. The method of manufacturing a silicon carbide semiconductor device according to claim 1, wherein
the resinous organic film comprises a photosensitive resin.

6. The method of manufacturing a silicon carbide semiconductor device according to claim 1, wherein
the resinous organic film comprises a photoresist.

7. A method of manufacturing a silicon carbide semiconductor device, comprising the steps of:
preparing one or more silicon carbide substrates having a first main surface and a second main surface located opposite to the first main surface;
forming a doped region in the silicon carbide substrate by doping the first main surface with an impurity;
forming a first protecting film on the first main surface; and
forming a second protecting film on the second main surface,
the step of forming the first protecting film being performed after the step of forming the doped region, and
the method further comprising the step of activating the impurity included in the doped region by annealing with at least a portion of the first main surface being covered with the first protecting film and at least a portion of the second main surface being covered with the second protecting film,
at least one of the first protecting film and the second protecting film is a carbon layer,
the carbon layer is formed by partially removing silicon from the silicon carbide substrate.

* * * * *